United States Patent
Zhang et al.

(10) Patent No.: US 7,259,457 B2
(45) Date of Patent: *Aug. 21, 2007

(54) DIE-UP BALL GRID ARRAY PACKAGE INCLUDING A SUBSTRATE CAPABLE OF MOUNTING AN INTEGRATED CIRCUIT DIE AND METHOD FOR MAKING THE SAME

(75) Inventors: Tonglong Zhang, Irvine, CA (US); Reza-ur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/939,075

(22) Filed: Sep. 13, 2004

(65) Prior Publication Data

US 2005/0051890 A1  Mar. 10, 2005

Related U.S. Application Data

(62) Division of application No. 09/849,537, filed on May 7, 2001.

(51) Int. Cl.
*H01L 23/34* (2006.01)

(52) U.S. Cl. .............. 257/713; 257/712; 257/706; 257/779; 257/780

(58) Field of Classification Search ............... 257/675, 257/676, 706, 737, 738, 778, 780, 786, 678, 257/712, 713, 720, 779
See application file for complete search history.

(56) References Cited

U.S. PATENT DOCUMENTS 3,790,866 A   2/1974  Meyer et al.
4,611,238 A   9/1986  Lewis et al.
5,045,921 A   9/1991  Lin et al.
5,065,281 A   11/1991 Hernandez et al.
5,173,766 A   12/1992 Long et al.
5,208,504 A   5/1993  Parker et al.
5,216,278 A   6/1993  Lin et al.

(Continued)

FOREIGN PATENT DOCUMENTS

EP    0 573 297 A2    12/1993

(Continued)

OTHER PUBLICATIONS

Charles A. Harper, Electronic Packaging and Interconnection Handbook, 2000, McGraw-Hill, p. 7.55 and 7.56.*

(Continued)

*Primary Examiner*—Monica Lewis
(74) *Attorney, Agent, or Firm*—Sterne Kessler Goldstein & Fox PLLC

(57) ABSTRACT

An electrically and thermally enhanced die-up tape substrate ball grid array (BGA) package and die-up plastic substrate BGA package are described. A substrate that has a first surface and a second surface is received. A heat spreader has a first surface and a second surface. The first heat spreader surface is attached to the second substrate surface. A plurality of solder balls are attached to the second substrate surface outside an outer dimensional profile of the heat spreader. The second heat spreader surface is configured to be coupled to a printed circuit board (PCB).

21 Claims, 7 Drawing Sheets

U.S. PATENT DOCUMENTS

| | | |
|---|---|---|
| 5,285,352 A | 2/1994 | Pastore et al. |
| 5,291,062 A | 3/1994 | Higgins, III |
| 5,294,826 A | 3/1994 | Marcantonio et al. |
| 5,366,589 A | 11/1994 | Chang |
| 5,394,009 A | 2/1995 | Loo |
| 5,397,917 A | 3/1995 | Ommen et al. |
| 5,397,921 A | 3/1995 | Karnezos |
| 5,409,865 A | 4/1995 | Karnezos |
| 5,433,631 A | 7/1995 | Beaman et al. |
| 5,438,216 A | 8/1995 | Juskey et al. |
| 5,474,957 A | 12/1995 | Urushima |
| 5,490,324 A | 2/1996 | Newman |
| 5,534,467 A | 7/1996 | Rostoker |
| 5,541,450 A | 7/1996 | Jones et al. |
| 5,552,635 A | 9/1996 | Kim et al. |
| 5,572,405 A | 11/1996 | Wilson et al. |
| 5,578,869 A | 11/1996 | Hoffman et al. |
| 5,583,377 A | 12/1996 | Higgins, III |
| 5,583,378 A | 12/1996 | Marrs et al. |
| 5,642,261 A | 6/1997 | Bond et al. |
| 5,648,679 A | 7/1997 | Chillara et al. |
| 5,650,659 A | 7/1997 | Mostafazadeh et al. |
| 5,650,662 A | 7/1997 | Edwards et al. |
| 5,691,567 A | 11/1997 | Lo et al. |
| 5,717,252 A | 2/1998 | Nakashima et al. |
| 5,736,785 A | 4/1998 | Chiang et al. |
| 5,744,863 A * | 4/1998 | Culnane et al. ............. 257/712 |
| 5,796,170 A | 8/1998 | Marcantonio |
| 5,798,909 A | 8/1998 | Bhatt et al. |
| 5,801,432 A | 9/1998 | Rostoker et al. |
| 5,835,355 A | 11/1998 | Dordi |
| 5,843,808 A | 12/1998 | Karnezos |
| 5,844,168 A | 12/1998 | Schueller et al. |
| 5,856,911 A | 1/1999 | Riley |
| 5,866,949 A | 2/1999 | Schueller |
| 5,883,430 A | 3/1999 | Johnson |
| 5,889,321 A | 3/1999 | Culnane et al. |
| 5,889,324 A | 3/1999 | Suzuki |
| 5,894,410 A | 4/1999 | Barrow |
| 5,895,967 A | 4/1999 | Stearns et al. |
| 5,901,041 A | 5/1999 | Davies et al. |
| 5,903,052 A * | 5/1999 | Chen et al. .................. 257/706 |
| 5,905,633 A | 5/1999 | Shim et al. |
| 5,907,189 A | 5/1999 | Mertol |
| 5,907,903 A | 6/1999 | Ameen et al. |
| 5,920,117 A | 7/1999 | Sono et al. |
| 5,949,137 A | 9/1999 | Domadia et al. |
| 5,953,589 A | 9/1999 | Shim et al. |
| 5,972,734 A | 10/1999 | Carichner et al. |
| 5,976,912 A | 11/1999 | Fukutomi et al. |
| 5,977,626 A | 11/1999 | Wang et al. |
| 5,977,633 A | 11/1999 | Suzuki et al. |
| 5,982,621 A | 11/1999 | Li |
| 5,986,340 A | 11/1999 | Mostafazadeh et al. |
| 5,986,885 A | 11/1999 | Wyland |
| 5,998,241 A | 12/1999 | Niwa |
| 5,999,415 A | 12/1999 | Hamzehdoost |
| 6,002,147 A | 12/1999 | Iovdalsky et al. |
| 6,002,169 A | 12/1999 | Chia et al. |
| 6,011,304 A | 1/2000 | Mertol |
| 6,011,694 A | 1/2000 | Hirakawa |
| 6,020,637 A | 2/2000 | Karnezos |
| 6,028,358 A | 2/2000 | Suzuki |
| 6,034,427 A | 3/2000 | Lan et al. |
| 6,040,984 A | 3/2000 | Hirakawa |
| 6,046,077 A * | 4/2000 | Baba ......................... 438/127 |
| 6,057,601 A | 5/2000 | Lau et al. |
| 6,060,777 A | 5/2000 | Jamieson et al. |
| 6,069,407 A | 5/2000 | Hamzehdoost |
| 6,077,724 A | 6/2000 | Chen |
| 6,084,297 A | 7/2000 | Brooks et al. |
| 6,084,777 A | 7/2000 | Kalidas et al. |
| 6,114,761 A | 9/2000 | Mertol et al. |
| 6,117,797 A | 9/2000 | Hembree |
| 6,122,171 A | 9/2000 | Akram et al. |
| 6,133,064 A | 10/2000 | Nagarajan et al. |
| 6,140,707 A | 10/2000 | Plepys et al. |
| 6,160,705 A | 12/2000 | Stearns et al. |
| 6,162,659 A | 12/2000 | Wu |
| 6,163,458 A | 12/2000 | Li |
| 6,166,434 A | 12/2000 | Desai et al. |
| 6,184,580 B1 | 2/2001 | Lin |
| 6,201,300 B1 | 3/2001 | Tseng et al. |
| 6,207,467 B1 | 3/2001 | Vaiyapuri et al. |
| 6,212,070 B1 | 4/2001 | Atwood et al. |
| 6,242,279 B1 | 6/2001 | Ho et al. |
| 6,246,111 B1 | 6/2001 | Huang et al. |
| 6,278,613 B1 | 8/2001 | Fernandez et al. |
| 6,288,444 B1 | 9/2001 | Abe et al. |
| 6,313,521 B1 | 11/2001 | Baba |
| 6,313,525 B1 | 11/2001 | Sasano |
| 6,347,037 B2 | 2/2002 | Iijima et al. |
| 6,362,525 B1 | 3/2002 | Rahim |
| 6,369,455 B1 | 4/2002 | Ho et al. |
| 6,380,623 B1 | 4/2002 | Demore |
| 6,462,274 B1 | 10/2002 | Shim et al. |
| 6,472,741 B1 | 10/2002 | Chen et al. |
| 6,525,942 B2 | 2/2003 | Huang et al. |
| 6,528,869 B1 | 3/2003 | Glenn et al. |
| 6,528,892 B2 | 3/2003 | Caletka et al. |
| 6,541,832 B2 | 4/2003 | Coyle |
| 6,545,351 B1 | 4/2003 | Jamieson et al. |
| 6,552,266 B2 | 4/2003 | Carden et al. |
| 6,552,428 B1 | 4/2003 | Huang et al. |
| 6,552,430 B1 | 4/2003 | Perez et al. |
| 6,563,712 B2 | 5/2003 | Akram et al. |
| 6,583,513 B1 * | 6/2003 | Utagikar et al. ............. 257/778 |
| 6,583,516 B2 | 6/2003 | Hashimoto |
| 6,602,732 B2 | 8/2003 | Chen |
| 6,614,660 B1 | 9/2003 | Bai et al. |
| 6,617,193 B1 | 9/2003 | Toshio et al. |
| 6,657,870 B1 | 12/2003 | Ali et al. |
| 6,664,617 B2 | 12/2003 | Siu |
| 6,724,071 B2 | 4/2004 | Combs |
| 6,724,080 B1 | 4/2004 | Ooi et al. |
| 6,906,414 B2 | 6/2005 | Zhao et al. |
| 2001/0001505 A1 | 5/2001 | Schueller et al. |
| 2001/0005050 A1 | 6/2001 | Ohsawa et al. |
| 2001/0040279 A1 | 11/2001 | Mess et al. |
| 2001/0045644 A1 | 11/2001 | Huang |
| 2002/0053731 A1 | 5/2002 | Chao et al. |
| 2002/0072214 A1 | 6/2002 | Yuzawa et al. |
| 2002/0079562 A1 | 6/2002 | Zhao et al. |
| 2002/0079572 A1 | 6/2002 | Khan et al. |
| 2002/0096767 A1 | 7/2002 | Cote et al. |
| 2002/0098617 A1 | 7/2002 | Lee et al. |
| 2002/0109226 A1 | 8/2002 | Khan et al. |
| 2002/0135065 A1 | 9/2002 | Zhao et al. |
| 2002/0171144 A1 | 11/2002 | Zhang et al. |
| 2002/0180040 A1 | 12/2002 | Camenforte et al. |
| 2002/0185717 A1 | 12/2002 | Eghan et al. |
| 2002/0185720 A1 | 12/2002 | Khan et al. |
| 2002/0185722 A1 | 12/2002 | Zhao et al. |
| 2002/0185734 A1 | 12/2002 | Zhao et al. |
| 2002/0185750 A1 | 12/2002 | Khan et al. |
| 2002/0190361 A1 | 12/2002 | Zhao et al. |
| 2002/0190362 A1 | 12/2002 | Khan et al. |
| 2003/0057550 A1 | 3/2003 | Zhao et al. |
| 2003/0111726 A1 | 6/2003 | Khan et al. |
| 2003/0138613 A1 | 7/2003 | Thoman et al. |
| 2003/0146503 A1 | 8/2003 | Khan et al. |
| 2003/0146506 A1 | 8/2003 | Khan et al. |
| 2003/0146509 A1 | 8/2003 | Zhao et al. |
| 2003/0146511 A1 | 8/2003 | Zhao et al. |

| | | | |
|---|---|---|---|
| 2003/0179549 A1 | 9/2003 | Zhong et al. | |
| 2003/0179556 A1 | 9/2003 | Zhao et al. | |
| 2004/0072456 A1 | 4/2004 | Dozier, II et al. | |
| 2005/0035452 A1* | 2/2005 | Zhang et al. | 257/738 |
| 2005/0280127 A1 | 12/2005 | Zhao et al. | |
| 2006/0065972 A1 | 3/2006 | Khan et al. | |

FOREIGN PATENT DOCUMENTS

| | | |
|---|---|---|
| EP | 0 504 411 B1 | 6/1998 |
| EP | 0865082 A1 | 9/1998 |
| FR | 2 803 098 A3 | 6/2001 |
| JP | 59-188948 | 10/1984 |
| JP | 10-247702 A | 9/1998 |
| JP | 10-247703 A | 9/1998 |
| JP | 11-17064 A | 1/1999 |
| JP | 11-102989 A | 4/1999 |
| JP | 11-307674 | 11/1999 |
| TW | 383908 | 3/2000 |
| TW | 417219 | 1/2001 |

OTHER PUBLICATIONS

Ahn, S.H. and Kwon, Y.S., "Popcorn Phenomena in a Ball Grid Array Package", *IEEE Transactions on Components, Packaging, and Manufacturing Technology Part B: Advanced Packaging*, IEEE, Aug. 1995, vol. 18, No. 3, pp. 491-495.

Amkor Electronics, "Amkor BGA Packaging: Taking The World By Storm", *Electronic Packaging & Production*, Cahners Publishing Company, May 1994, page unknown.

Anderson, L. and Trabucco, B., "Solder Attachment Analysis of Plastic BGA Modules", *Surface Mount International Conference*, Surface Mount International, Aug. 28-Sep. 1, 1994, San Jose, California, pp. 189-194.

Andrews, M., "Trends in Ball Grid Array Technology," *Ball Grid Array National Symposium*, Mar. 29-30, 1995, Dallas, Texas, 10 pages.

Attarwala, A.I. Dr. and Stierman, R., "Failure Mode Analysis of a 540 Pin Plastic Ball Grid Array", *Surface Mount International Conference*, Surface Mount International, Aug. 28-Sep. 1, 1994, San Jose, California, pp. 252-257.

Banerji, K., "Development of the Slightly Larger Than IC Carrier (SLICC)", *Journal of Surface Mount Technology*, Jul. 1994, pp. 21-26.

Bauer, C., Ph.D., "Partitioning and Die Selection Strategies for Cost Effective MCM Designs", *Journal of Surface Mount Technology*, Oct. 1994, pp. 4-9.

Bernier, W.E. et al., "BGA vs. QFP: A Summary of Tradeoffs for Selection of High I/O Components", *Surface Mount International Conference Proceedings*, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages", *IEEE Transactions on Components, Packaging, and Manufacturing Technology Part A*, IEEE, Dec. 1995, vol. 18, No. 4, pp. 732-738.

Chadima, M., "Interconnecting Structure Manufacturing Technology," *Ball Grid Array National Symposium*, Dallas, Texas, Mar. 29-30, 1995, 12 pages.

Chanchani, R. et al., "Mini BGA: Pad and Pitch Ease Die Test and Handling", *Advanced Packaging*, IHS Publishing Group, May/Jun. 1995, pp. 34 and 36-37.

Chung, T.C. et al., "Rework of Plastic, Ceramic, and Tape Ball Grid Array Assemblies", *Ball Grid Array National Symposium Proceedings*, Dallas, Texas, Mar. 29-30, 1995, pp. 1-15.

Cole, M.S. and Caulfield, T. "A Review of Available Ball Grid Array (BGA) Packages", *Journal of Surface Mount Technology*, Surface Mount Technology Association, Jan. 1996, vol. 9, pp. 4-11.

Cole, M.S. and Caulfield, T., "Ball Grid Array Packaging", *Surface Mount International Conference Proceedings*, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", *Advanced Packaging*, IHS Publishing Group, Sep./Oct. 1994, vol. 3, No. 5, pp. 28, 30 and 32.

Dody, G. and Burnette, T., "BGA Assembly Process and Rework", *Journal of Surface Mount Technology*, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP LOC and BGA Packages", *45th Electronic Components & Technology Conference*, IEEE, May 21-24, 1995, Las Vegas, NV, pp. 285-292.

Ejim, T.L. et al., "Designed Experiment to Determine Attachment Reliability Drivers for PBGA Packages", *Journal of Surface Mount Technology*, Surface Mount Technology Association, Jan. 1996, vol. 9, pp. 30-38.

English-language Abstract of JP 10-189835, published Jul. 21, 1998, 1 page, printed from http://v3.espacenet.com.

English-language Translation of JP 10-247702, published Sep. 14, 1998, 8 pages.

English-language Abstract of JP 10-247703, published Sep. 14, 1998, 1 page, printed from http://v3.espacenet.com.

Ewanich, J. et al., "Development of a Tab (TCP) Ball Grid Array Package", *Proceedings of the 1995 International Electronics Packaging Conference*, San Diego, CA, Sep. 24-27, 1995, pp. 588-594.

Fauser, S. et al, "High Pin-Count PBGA Assembly", *Circuits Assembly*, Feb. 1995, vol. 6, No. 2, pp. 36-38 and 40.

Fauser, Suzanne et al., "High Pin Count PBGA Assembly: Solder Defect Failure Modes and Root Cause Analysis", *Surface Mount International, Proceedings of The Technical Program*, Surface Mount International, Aug. 28-Sep. 1, 1994, San Jose, California, pp. 169-174.

Ferguson, M. "Ensuring High-Yield BGA Assembly", *Circuits Assembly*, Feb. 1995, vol. 6, No. 2, pp. 54, 56 and 58.

Freda, M., "Laminate Technology for IC Packaging", *Electronic Packaging & Production*, Cahners Publishing Company, Oct. 1995, vol. 35, No. 11, pp. S4-S5.

Freedman, M., "Package Size and Pin-Out Standardization", *Ball Grid Array National Symposium*, Mar. 29-30, 1995, 6 pages.

Freyman, B. and Pennisi, R., "Overmolded Plastic Pad Array Carriers (OMPAC): A Low Cost, High Interconnect Density IC Packaging Solution for Consumer and Industrial Electronics", *41st Electronic Components & Technology Conference*, IEEE, May 11-16, 1991, pp. 176-182.

Freyman, B. et al., "Surface Mount Process Technology for Ball Grid Array Packaging", *Surface Mount International Conference Proceedings*, Surface Mount International, Aug. 29-Sep. 2, 1993, San Jose, California, pp. 81-85.

Freyman, B. et al., "The Move to Perimeter Plastic BGAs", *Surface Mount International Conference Proceedings*, San Jose, CA, Aug. 29-31, 1995, pp. 373-382.

Freyman, B., "Trends in Plastic BGA Packaging," *Ball Grid Array National Symposium*, Dallas, Texas, Mar. 29-30, 1995, 44 pages.

Gilleo, K., "Electronic Polymers: Die Attach and Oriented Z-Axis Films", *Advanced Packaging*, IHS Publishing Group, Sep./Oct. 1994, vol. 3, No. 5, pp. 37-38, 40 and 42.

Guenin, B. et al., "Analysis of a Thermally Enhanced Ball Grid Array Package", *IEEE Transactions on Components, Packaging, and Manufacturing Technology, Part A*, IEEE Components, Packaging, and Manufacturing Technology Society, Dec. 1995, vol. 18, No. 4, pp. 749-757.

Hart, C. "Vias in Pads", *Circuits Assembly*, Feb. 1995, vol. 6, No. 2, pp. 42, 44-46 and 50.

Hart, C., "Vias in Pads for Coarse and Fine Pitch Ball Grid Arrays", *Surface Mount International Conference Proceedings*, Surface Mount International, Aug. 28-Sep. 1, 1994, San Jose, California, pp. 203-207.

Hattas, D., "BGAs Face Production Testing: New Package Offers Promise but Must Clear Technology Hurdles.", *Advanced Packaging*, IHS Publishing Group, Summer 1993, vol. 2, No. 3, pp. 44-46.

Hayden, T.F. et al., "Thermal & Electrical Performance and Reliability Results for Cavity-Up Enhanced BGAs", *Electronic Components and Technology Conference*, IEEE, 1999, pp. 638-644.

Heitmann, R., "A Direct Attach Evolution: TAB, COB and Flip Chip Assembly Challenges", *Advanced Packaging*, IHS Publishing Group, Jul./Aug. 1994, vol. 3, No. 4, pp. 95-99.

Hodson, T., "Study Examines BGA Use", *Electronic Packaging & Production*, Mar. 1993, page unknown.

Holden, H., "The Many Techniques of Small Via Formation for Thin Boards", *The Institute for Interconnecting and Packaging Electronic Circuits Ball Grid Array National Symposium*, San Diego, CA, Jan. 18-19, 1996, pp. 1-7.

Houghten, J., "New Package Takes On QFPs", *Advanced Packaging*, IHS Publishing Group, Winter 1993, vol. 2, No. 1, pp. 38-39.

Houghten, J.L., "Plastic Ball-Grid Arrays Continue To Evolve", *Electronic Design*, Feb. 6, 1995, pp. 141-146.

"How To Give Your BGAs A Better Bottom Line.", *Advanced Packaging*, IHS Publishing Group, May/Jun. 1995, page unknown.

Huang, W. and Ricks, J., "Electrical Characterization of PBGA for Communication Applications by Simulation and Measurement", *National Electronic Packaging and Production Conference West '95*, Feb. 26-Mar. 2, 1995, Anaheim, California, pp. 300-307.

Hundt, M. et al., "Thermal Enhancements of Ball Grid Arrays", *National Electronic Packaging and Production Conference West '95*, Reed Exhibition Companies, Anaheim, CA, Feb. 25-29, 1996, pp. 702-711.

Hutchins, C.L., "Understanding Grid Array Packages", *Surface Mount Technology Magazine*, IHS Publishing Group, Nov. 1994, vol. 8, No. 11, pp. 12-13.

Hwang, J.S., "A Hybrid of QFP and BGA Architectures", *Surface Mount Technology Magazine*, IHS Publishing Group, Feb. 1995, vol. 9, No. 2, p. 18.

Hwang, J.S., "Reliability of BGA Solder Interconnections", *Surface Mount Technology Magazine*, IHS Publishing Group, Sep. 1994, vol. 8, No. 9, pp. 14-15.

Johnson, R. et al., "A Feasibility Study of of Ball Grid Array Packaging", *National Electronic Packaging and Production Conference East '93*, Boston, Massachusetts, Jun. 14-17, 1993, pp. 413-422.

Johnson, R. et al., "Thermal Characterization of 140 and 225 Pin Ball Grid Array Packages", *National Electronic Packaging & Production Conference East '93*, Boston, Massachusetts, Jun. 14-17, 1993, pp. 423-430.

Johnston, P. "Printed Circuit Board Design Guidelines for Ball Grid Array Packages", *Journal of Surface Mount Technology*, Surface Mount Technology Association, Jan. 1996, vol. 9, pp. 12-18.

Johnston, P., "Land Pattern Interconnectivity Schemes", *Ball Grid Array National Symposium*, Dallas, Texas, Mar. 29-30, 1995, pp. 2-21.

Karnezos, M. , "An EPBGA Alternative," *Advanced Packaging*, Jun. 1998, pp. 90, 92, 94, and 96.

Kawahara, T. et al., "Ball Grid Array Type Package By Using of New Encapsulation Method", *Proceedings of the 1995 International Electronics Packaging Conference*, San Diego, CA, Sep. 24-27, 1995, pp. 577-587.

Knickerbocker, J.U. and Cole, M.S., "Ceramic BGA: A Packaging Alternative", *Advanced Packaging*, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", *National Electronic Packaging and Production Conference West '95*, IEEE, Feb. 26-Mar. 2, 1995, Anaheim, California, pp. 1523-1529.

Kunkle, R., "Discrete Wiring for Array Packages", *Ball Grid Array National Symposium*, Dallas, Texas, Mar. 29-30, 1995, 9 pages.

Lall, B. et al, "Methodology for Thermal Evaluation of Multichip Modules", *IEEE Transactions on Components, Packaging, and Manufacturing Technology Part A*, IEEE, Dec. 1995, vol. 18, No. 4, pp. 758-764.

Lasance, C. et al., "Thermal Characterization of Electronic Devices with Boundary Condition Independent Compact Models", *IEEE Transactions on Components, Packaging, and Manufacturing Technology Part A*, IEEE Components, Packaging, and Manufacturing Technology Society, Dec. 1995, vol. 18, No. 4, pp. 723-731.

Lau, J. et al., "No Clean Mass Reflow of Large Plastic Ball Grid Array Packages", *Circuit World*, Wela Publications Ltd., vol. 20, No. 3, Mar. 1994, pp. 15-22.

Lau, J., *Ball Grid Array Technology*, McGraw-Hill Inc., 1995, entire book submitted.

"Literature Review", Special Supplement to *Electronic Packaging & Production*, Feb. 1995, Cahners Publication, 10 pages.

*LSI LOGIC Package Selector Guide, Second Edition*, LSI Logic Corporation, 1994-1995, entire document submitted.

"LTCC MCMs Lead to Ceramic BGAs," *Advanced Packaging*, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", *Journal of Surface Mount Technology*, Surface Mount International, Oct. 1994, pp. 33-41.

Marrs, R. et al., "Recent Technology Breakthroughs Achieved with the New *Super*BGA® Package", *1995 International Electronics Packaging Conference*, San Diego, California, Sep. 24-27, 1995, pp. 565-576.

Marrs, R.C. and Olachea, G., "BGAs For MCMs: Changing Markets and Product Functionality", *Advanced Packaging*, IHS Publishing Group, Sep./Oct. 1994, vol. 3, No. 5, pp. 48, 50, and 52.

Matthew, L.C. et al., "Area Array Packaging: KGD in a Chip-Sized Package", *Advanced Packaging*, IHS Publishing Group, Jul./Aug. 1994, pp. 91-94.

Mawer, A. et al., "Plastic BGA Solder Joint Reliability Considerations", *Surface Mount International Conference Proceedings*, Surface Mount International, Aug. 28-Sep. 1, 1994, San Jose, California, pp. 239-251.

Mazzullo, T. and Schaertl, L., "How IC Packages Affect PCB Design", *Surface Mount Technology Magazine*, Feb. 1995, vol. 9, No. 2, pp. 114-116.

Mearig, J., "An Overview of Manufacturing BGA Technology", *National Electronic Packaging and Production Conference West '95*, Feb. 26-Mar. 2, 1995, Anaheim, California, pp. 295-299.

Mertol, A., "Application of the Taguchi Method on the Robust Design of Molded 225 Plastic Ball Grid Array Packages", *IEEE Transactions on Components, Packaging, and Manufacturing Technology Part B: Advanced Packaging*, IEEE, Nov. 1995, vol. 18, No. 4, pp. 734-743.

Mescher, P. and Phelan, G., "A Practical Comparison of Surface Mount Assembly for Ball Grid Array Components", *Surface Mount International Conference Proceedings*, Surface Mount International, Aug. 28-Sep. 1, 1994, San Jose, California, pp. 164-168.

Mulgaonker, S. et al., "An Assessment of the Thermal Performance of the PBGA Family", *Eleventh Annual IEEE Semiconductor Thermal Measurement and Management Symposium*, IEEE, San Jose, CA, Feb. 7-9, 1995, pp. 17-27.

"New PBGA Pushes Technology to Outer Limits", *Advanced Packaging*, HIS Publishing Group, Jan./Feb. 1995, p. 11.

Olachea, G., "Managing Heat: A Focus on Power IC Packaging", *Electronic Packaging & Production (Special Supplement)*, Cahners Publishing Company, Nov. 1994, pp. 26-28.

"Pad Array Improves Density", *Electronic Packaging & Production*, Cahners Publishing Company, May 1992, pp. 25-26.

Partridge, J. and Viswanadham, P., "Organic Carrier Requirements for Flip Chip Assemblies", *Journal of Surface Mount Technology*, Surface Mount Technology Association, Jul. 1994, pp. 15-20.

Ramirez, C. and Fauser, S., "Fatigue Life Comparison of The Perimeter and Full Plastic Ball Grid Array", *Surface Mount International Conference Proceedings*, Surface Mount International, Aug. 28-Sep. 1, 1994, San Jose, California, pp. 258-266.

Rogren, P., "MCM-L Built on Ball Grid Array Formats", *National Electronic Packaging and Production Conference West '94*, Feb. 27-Mar. 4, 1994, Anaheim, California, pp. 1277-1282.

Rooks, S., "X-Ray Inspection of Flip Chip Attach Using Digital Tomosynthesis", *Surface Mount International Proceedings of The Technical Program*, Aug. 28-Sep. 1, 1994, San Jose, California, pp. 195-202.

Rukavina, J., "Attachment Methodologies: Ball Grid Array Technology", *Ball Grid Array National Symposium*, Dallas, Texas, Mar. 29-30, 1995, 36 pages.

Sack, T., "Inspection Technology", *Ball Grid Array National Symposium*, Dallas, Texas, Mar. 29-30, 1995, pp. 1-41.

Sakaguchi, H., "BGA Mounting Technology," pp. 1-4, date and source unknown.

Schmolze, C. and Fraser, A., "SPICE Modeling Helps Enhance BGA Performance", *Electronic Packaging & Production*, Jan. 1995, pp. 50-52.

*Semiconductor Group Package Outlines Reference Guide*, Texas Instruments, 1995, entire document submitted.

Shimizu, J., "Plastic Ball Grid Array Coplanrity", *Surface Mount International Conference*, San Jose, California, Aug. 31-Sep. 2, 1993, pp. 86-91.

Sigliano, R., "Using BGA Packages: An Appealing Technology in a QFP and Fine-Pitch Market", *Advanced Packaging*, IHS Publishing Group, Mar./Apr. 1994, pp. 36-39.

Sirois, L., "Dispensing for BGA: Automated Liquid Dispensing in a High-Density Environment", *Advanced Packaging*, IHS Publishing Group, May/Jun. 1995, pp. 38 and 41.

Solberg, V., "Interconnection Structure Preparation: Impact of Material Handling and PCB Surface Finish on SMT Assembly Process Yield", *Ball Grid Array National Symposium*, Dallas Texas, Mar. 29-30, 1995, 9 pages.

"Survival of the Fittest", *Advanced Packaging*, IHS Publishing Group, Mar./Apr. 1995, page unknown.

Thompson, T., "Reliability Assessment of a Thin (Flex) BGA Using a Polyimide Tape Substrate", *International Electronics Manufacturing Technology Symposium*, IEEE, 1999, pp. 207-213.

Tuck, J., "BGA Technology Branches Out", *Circuits Assembly*, Feb. 1995, vol. 6, No. 2, pp. 24, 26, and 28.

"Tutorial and Short Courses", *45th Electronic Components & Technology Conference*, May 21-24, 1995, Las Vegas, Nevada, IEEE, 4 pages.

Vardaman, E. J. and Crowley, R.T., "Worldwide Trends In Ball Grid Array Developments", *National Electronic Packaging and Production Conference West '96*, Reed Exhibition Companies, Anaheim, CA, Feb. 25-29, 1996, pp. 699-701.

Walshak, D. and Hashemi, H., "BGA Technology: Current and Future Direction for Plastic, Ceramic and Tape BGAs", *Surface Mount International Conference Proceedings*, Surface Mount International, Aug. 28-Sep. 1, 1994, San Jose, California, pp. 157-163.

Walshak, D. and Hashemi, H., "Thermal Modeling of a Multichip BGA Package", *National Electronic Packaging and Production Conference West '94*, Reed Exhibition Companies, Anaheim, California, Feb. 27-Mar. 4, 1994, pp. 1266-1276.

Xie, H. et al., "Thermal Solutions to Pentium Processors in TCP in Notebooks and Sub-Notebooks", *45th Electronic Components & Technology Conference*, IEEE, Las Vegas, NV, May 21-24, 1995, pp. 201-210.

Yip, W.Y., "Package Characterization of a 313 Pin BGA", *National Electronic Packaging and Production Conference West '95*, Reed Exhibition Companies, Feb. 26-Mar. 2, 1995, Anaheim, California, pp. 1530-1541.

Zamborsky, E., "BGAs in the Assembly Process", *Circuits Assembly*, Feb. 1995, vol. 6, No. 2, pp. 60, 62-64.

Zhao, Z., Ph.D., "IC Package Thermal Issues and Thermal Design," ASAT, Inc., Jan. 14, 2000, 98 pages, presented at $2^{nd}$ *International Icepak User's Group Meeting*, Palo Alto, CA, on Feb. 7, 2000.

Zhao, Z., Ph.D., "Thermal Design and Modeling of Packages," *IEEE Short Courses*, Broadcom Corporation, Oct. 25, 2000, 95 pages.

Zimerman, M., "High Performance BGA Molded Packages for MCM Application", *Surface Mount International Conference Proceedings*, Surface Mount International, Aug. 28-Sep. 1, 1994, San Jose, California, pp. 175-180.

Zweig, G., "BGAs: Inspect the Process, Not the Product", *Electronic Packaging & Production (Special Supplement)*, Cahners Publishing Company, Aug. 1994 (Supplement), p. 41.

Freyman, B. and Petrucci, M., "High-Pincount PBGAs: Implementation Into Volume Manufacturing," *Advanced Packaging*, An IHS Group Publication, May/Jun. 1995, pp. 44-46.

Zhao et al., U.S. Appl. No. 10/284,340, filed Oct. 31, 2002, entitled "Ball Grid Array Package With Patterned Stiffener Layer," 137 pages.

Patent Abstracts of Japan, Publication No. 59188948, Oct. 26, 1984, vol. 009, No. 049.

Patent Abstracts of Japan, Publication No. 11-307674, Nov. 5, 1999, vol. 2000, No. 2.

European Search Report from European Application No. 2252969.7-2003, 3 pages, (mailed Mar. 3, 2005).

Amkor package data sheet, "SuperFC® ", from http://www.amkor.com/Products/all_datasheets/superfc.pdf, 2 pages (Jan. 2003).

Andros, F., "Tape Ball Grid Array," from Puttlitz, K.J. and Totta, P.A. (eds.), *Area Array Interconnection Handbook*, pp. 619-620, ISBN No. 0-7923-7919-5, Kluwer Academic Publishers (2001).

Brofman, P.J. et al., "Flip-Chip Die Attach Technology," Puttlitz, K.J. and Totta, P.A. (eds.), *Area Array Interconnection Handbook*, pp. 315-349, ISBN No. 0-7923-7919-5, Kluwer Academic Publishers (2001).

Ghosal, B. et al., "Ceramic and Plastic Pin Grid Array Technology," Puttlitz, K.J. and Totta, P.A. (eds.), *Area Array Interconnection Handbook*, pp. 551-576, ISBN No. 0-7923-7919-5, Kluwer Academic Publishers (2001).

Harper, C.A. (ed.), *Electronic Packaging And Interconnection Handbook*, Third Edition, pp. 7.58-7.59, ISBN No. 0-07-134745-3, McGraw-Hill Companies (2000).

Lin, S. and Chang, N., "Challenges in Power-Ground Integrity," *Proceedings Of The 2001 International Conference On Computer-Aided Design*, pp. 651-654 (Nov. 4-8, 2001).

Lloyd, J. and Overhauser, D., "Electromigration wreaks havoc on IC design," *EDN*, pp. 145-148 (Mar. 26, 1998).

Song, W.S. and Glasser, L.A., "Power Distribution Techniques for VLSI Circuits," *IEEE Journal Of Solid-State Circuits*, vol. SC-21, No. 1, pp. 150-156 (Feb. 1986).

Tang, K.T. and Friedman, E.G., "Simultaneous Switching Noise in On-Chip CMOS Power Distribution Networks," *IEEE Transactions On Very Large Scale Integration (VLSI) Systems*, vol. 10, No. 4, pp. 487-493 (Aug. 2002).

\* cited by examiner

DIE-UP BALL GRID ARRAY PACKAGE INCLUDING A SUBSTRATE CAPABLE OF MOUNTING AN INTEGRATED CIRCUIT DIE AND METHOD FOR MAKING THE SAME

CROSS-REFERENCE TO RELATED APPLICATION(S)

This application is a divisional of U.S. patent application Ser. No. 09/849,537 entitled "Die-Up Ball Grid Array Package with a Heat Spreader and Method for Making the Same," filed May 7, 2001, which is incorporated herein by reference in its entirety.

BACKGROUND OF THE INVENTION

1. Field of the Invention

The invention relates generally to the field of integrated circuit (IC) device packaging technology, and more particularly to heat spreading techniques in ball grid array (BGA) packages.

2. Related Art

Integrated circuit (IC) dies are typically mounted in or on a package that is attached to a printed circuit board (PCB). One such type of IC die package is a ball grid array (BGA) package. BGA packages provide for smaller footprints than many other package solutions available today. A BGA package has an array of solder balls located on a bottom external surface of a package substrate. The solder balls are reflowed to attach the package to the PCB. The IC die is mounted to a top surface of the package substrate. Wire bonds typically couple signals in the IC die to the substrate. The substrate has internal routing which electrically couples the IC die signals to the solder balls on the bottom substrate surface.

A number of BGA package substrate types exist, including ceramic, plastic, and tape (also known as "flex"). In some BGA package types, a stiffener may be attached to the substrate to supply planarity and rigidity to the package. In such packages, the IC die may be mounted to the stiffener instead of the substrate. Openings in the stiffener may be used to allow the IC die to be wire-bonded to the substrate.

Die-up and die-down BGA package configurations exist. In die-up BGA packages, the IC die is mounted on a top surface of the substrate or stiffener, opposite of the side to which the solder balls are attached. In die-down BGA packages, the IC die is mounted on a bottom surface of the substrate or stiffener, on the same side as which the solder balls are attached.

Conventional BGA packages are subject to high thermal stresses that result from the heat given off during operation of the mounted IC die. The thermal stresses are primarily imposed on the IC die and solder balls due to the mismatch of the thermal expansion coefficient (CTE) between the semiconductor die and the metal stiffener. As a result, conventional flex BGA packages have difficulty in meeting reliability requirements for die sizes larger than 9 mm. See, e.g., Thompson, T., et al., *Reliability Assessment of a Thin (Flex) BGA Using a Polyimide Tape Substrate*, International Electronics Manufacturing Technology Symposium, IEEE, pp. 207-213 (1999).

The tape substrate used in flex BGA packages is typically polyimide, which has very low values of thermal conductivity. Consequently, the IC die is separated from the PCB by the tape substrate thermal barrier. The lack of direct thermal connection from IC die to PCB leads to relatively high resistance to heat transfer from IC die-to-board (theta-jb).

A stiffener attached to a substrate enhances heat spreading. However, the openings on the stiffener for wire bond connections tend to reduce the thermal connections between the IC die and the edges of the stiffener. As a result, heat spreading is limited largely to the region of the IC die attach pad, while areas at the stiffener peripheral do not contribute effectively to heat spreading.

Furthermore, because of the high density of the substrate routing circuitry, it is difficult to bond each power and ground pad on the IC die to the substrate by a corresponding bond finger. As a result, the distribution of ground and power signals connecting to the IC die is frequently compromised in conventional BGA packages.

Ball grid array packages that use plastic substrates (for example, BT or FR4 plastic) are commonly known as plastic BGAs, or PBGAs. See, e.g., Lau, J. H., *Ball Grid Array Technology*, McGraw-Hill, New York, (1995). A PBGA package, for example, may add solder balls to the bottom substrate surface under the IC die to aid in conducting heat to the PCB. Solder balls such as these are referred to as thermal balls. The cost of the PBGA package, however, will increase with the number of thermal balls. Furthermore, a large array of thermal balls may be necessary for heat dissipation into the PCB for high levels of IC device power.

Hence, what is needed are BGA packages with improved heat spreading capabilities, while also providing for high levels of IC electrical performance.

SUMMARY OF THE INVENTION

The present invention is directed at ball grid array (BGA) packages having enhanced electrical and thermal characteristics. In one aspect, a substrate has a first surface and a second surface. A heat spreader has a first surface and a second surface. The first heat spreader surface is attached to the second substrate surface. A plurality of solder balls are attached to the second substrate surface outside an outer dimensional profile of the heat spreader. The second heat spreader surface is configured to be coupled to a printed circuit board (PCB).

In a further aspect, a metal ring is attached to the first substrate surface. An outer profile of said heat spreader overlaps with an inner profile of the metal ring.

In a still further aspect, the substrate has a window opening. An integrated circuit (IC) die is mounted to the first heat spreader surface and is accessible through the window opening. The IC die has a surface that includes at least one contact pad. A wire bond corresponding to each contact pad couples the contact pad to a corresponding metal trace on the first substrate surface. The IC die has a surface that includes at least one ground contact pad. A ground wire bond corresponding to each ground contact pad couples the ground contact pad to the first heat spreader surface. The second heat spreader surface is coupled to a ground potential of the PCB.

In an alternative aspect, an IC die is mounted to the first substrate surface. The IC die is mounted to the first substrate surface in a flip chip configuration. At least one conductive bump on an active surface of the IC die is connected to a corresponding conductive pad on the first substrate surface. A second heat spreader is attached to a non-active surface of said IC die.

In a further aspect, at least one via extends through the substrate. Each via is filled with a conductive material to couple one of the conductive bumps to the first heat spreader.

Further aspects of the present invention, and further features and benefits thereof, are described below. The accompanying drawings, which are incorporated herein and form a part of the specification, illustrate the present invention and, together with the description, further serve to explain the principles of the invention and to enable a person skilled in the pertinent art to make and use the invention.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
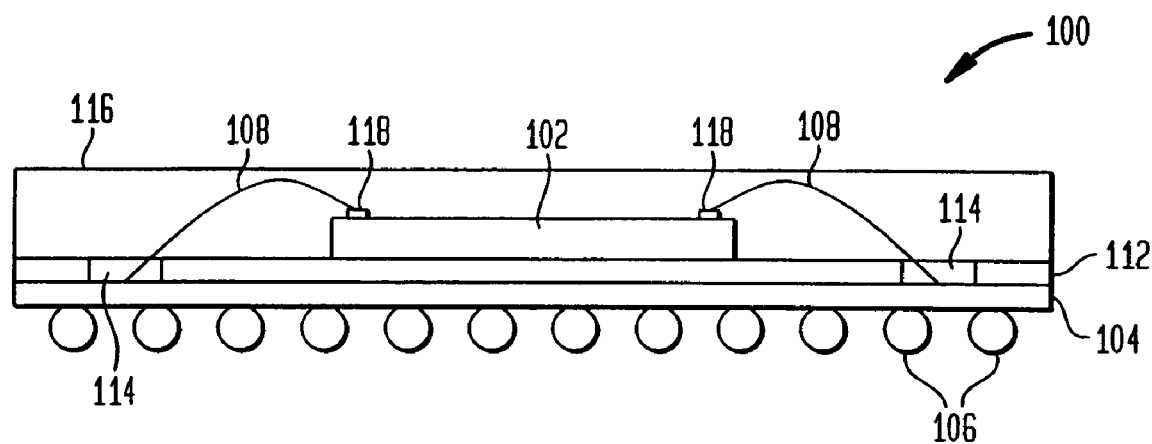
FIG. 1 illustrates a cross-sectional view of a die-up BGA package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

Overview

The present invention is directed to a method and system for improving the mechanical, thermal, and electrical performance of BGA packages. The present invention is applicable to all types of BGA substrates, including ceramic, plastic, and tape (flex) BGA packages. Furthermore the present invention is applicable to die-up (cavity-up) and die-down (cavity-down) orientations.

Numerous embodiments of the present invention are presented herein. In a first embodiment, the BGA package IC die is mounted to a heat spreader. In a second embodiment, a heat spreader is attached to a first side of a BGA package substrate, and the IC die is mounted to a second side of the substrate. In a third embodiment, a heat spreader is again mounted to the first side of the substrate, and the IC die is mounted to the second side of the substrate in a flip chip configuration. In a fourth embodiment, a heat spreader is again mounted to the first side of the substrate, and the IC die is mounted to the second side of the substrate in a flip chip configuration. Furthermore, a second heat spreader is mounted to a top surface of the IC die. In each embodiment, BGA package thermal dissipation and electrical performance are improved. In each embodiment, the first heat spreader may be coupled to a printed circuit board (PCB) to further improve thermal and electrical performance. The embodiments of the present invention presented herein allow large size dies with high input and output (I/O) counts to be packaged using BGA technology. For example, additional I/O counts may be gained due to the elimination or reduction in ground solder balls by the present invention.

Ball grid array package types are described below. Further detail on the above described embodiments, and additional embodiments according to the present invention, are presented below. The embodiments described herein may be combined in any applicable manner, as required by a particular application.

Ball Grid Array (BGA) Packages

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but partially or entirely cover the bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., *Ball Grid Array Technology*, McGraw-Hill, New York, (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

A number of BGA package substrate types exist, including ceramic, plastic (PBGA), and tape (also known as "flex"). FIG. 1 illustrates a die-up flex BGA package 100. Flex BGA package 100 includes an IC die 102, a tape substrate 104, a plurality of solder balls 106, one or more wire bonds 108, and a stiffener 112. Tape or flex BGA packages are particularly appropriate for large IC dies with large numbers of input and outputs, such as application specific integrated circuits (ASIC) and microprocessors.

Tape substrate 104 is generally made from one or more conductive layers bonded with a dielectric material. For instance, the dielectric material may be made from various substances, such as polyimide tape. The conductive layers are typically made from a metal, or combination of metals, such as copper and aluminum. Trace or routing patterns are made in the conductive layer material. Substrate 104 may be a single-layer tape, a two-layer tape, or additional layer tape substrate type. In a two-layer tape, the metal layers sandwich the dielectric layer, such as in a copper-Upilex-copper arrangement. As described above, the IC die is separated from the PCB by the thermal barrier of substrate 104. In a plastic substrate embodiment, the plastic substrate may include one or more metal layers formed on an organic substrate (for example, BT resin or FR4 epoxy/glass).

In some BGA package types, particularly in flex BGA packages, a stiffener can be attached to the substrate to add planarity and rigidity to the package, such as stiffener 112. Stiffener 112 may be laminated to substrate 104. Stiffener 112 is typically made from a metal, or combination of metals, such as copper, tin, and aluminum. Alternatively, stiffener 112 may be made from a polymer. Stiffener 112 also may act as a heat sink, and allow for greater heat spreading in BGA package 100.

One or more wire bonds 108 connect IC die 102 to substrate 104. Wire bonds 108 may be gold, copper, or other types of conductors. When stiffener 112 is present, one or more openings 114 in stiffener 112 may be used to allow for wire bonds 108 to connect IC die 102 to substrate 104. Stiffener 112 may be configured in other ways, and have different opening arrangements than shown in FIG. 1.

Figure 2:
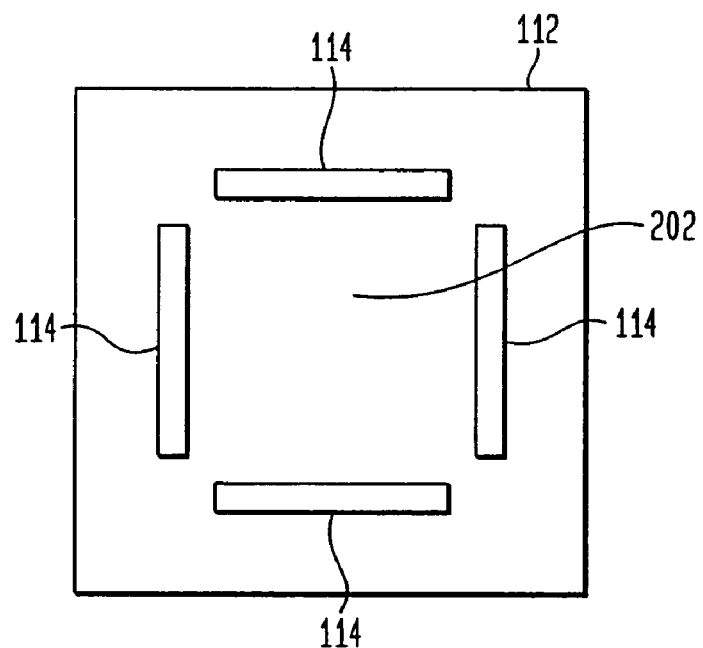
FIG. 2 illustrates a top view of a stiffener.

The use of a stiffener in a flex BGA package requires additional considerations when attempting to manage heat spreading. FIG. 2 shows a top view of stiffener 112. Stiffener 112 includes an opening 114 adjacent to all four sides of an IC die mounting position 202 in the center of stiffener 112. Heat transfer from IC die mounting position 202 to the edges of stiffener 112 is substantially limited by openings 114. Openings 114 act as thermal barriers to heat spreading in stiffener 112.

IC die 102 is attached to stiffener 112. In alternative configurations, when a stiffener is not present, IC die 102 may be attached directly to substrate 104. IC die 102 may be attached by an epoxy, for example. IC die 102 is any type of semiconductor integrated circuit.

An encapsulant 116, which may be an epoxy, mold compound, or other encapsulating material, covers IC die 102 and wire bonds 108 for mechanical and environmental protection.

Note that although wire bonds, such as wire bonds 108, are shown and described herein, IC dies may be mounted and coupled to a substrate with solder balls located on the bottom (active) surface of the IC die, by a process commonly referred to as "C4" or "flip chip" interconnect.

Figure 11:
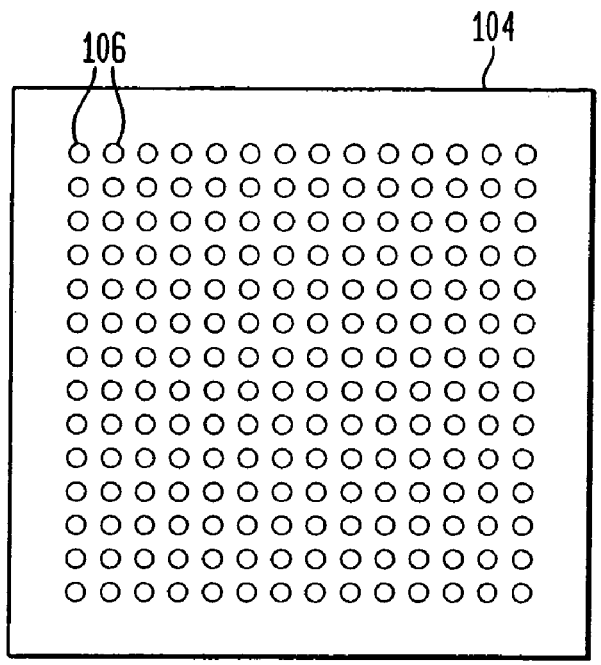
FIG. 11 shows a view of an exemplary solder ball arrangement for a BGA package.

FIG. 11 shows a view of an exemplary solder ball arrangement for a BGA package. FIG. 11 shows a 14 by 14 array of solder balls 106 on the bottom surface of substrate 104. Other sized arrays of solder balls are also applicable to the present invention. Solder balls 106 are reflowed to attach the BGA package to a PCB. The PCB may include contact pads to which solder balls 106 are bonded. PCB contact pads are generally made from a metal or combination of metals, such as copper, nickel, tin, and gold. The solder ball array may be organized in any number of ways, according to the requirements of the particular BGA package application.

Figure 4:
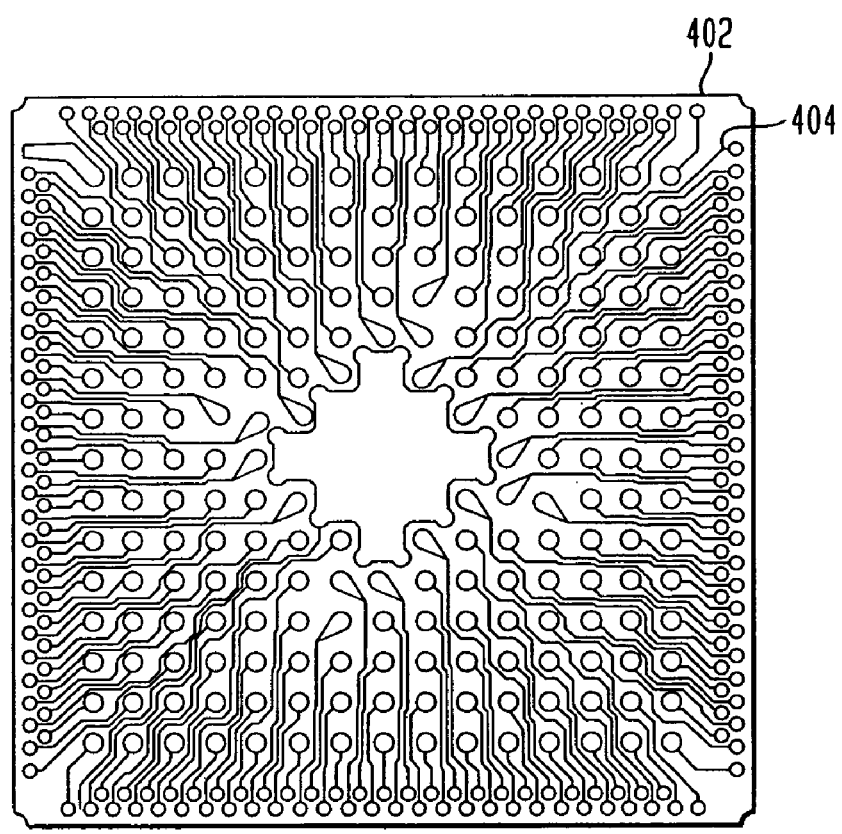
FIG. 4 shows exemplary routing in a substrate layer.

As described above, the BGA package substrate provides vias and routing on one or more layers to connect contact pads for wire bonds on its upper surface to solder balls attached to the bottom substrate surface. FIG. 4 shows an example routing 404 in a substrate layer 402 for accomplishing this.

Figure 3:
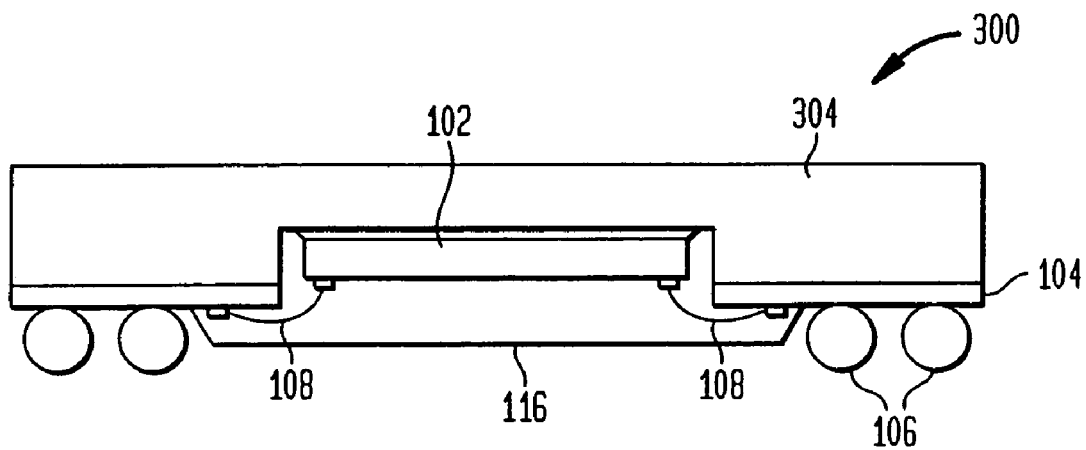
FIG. 3 illustrates a cross-sectional view of a die-down BGA package.

FIG. 3 illustrates a die-down BGA package 300. Die-down BGA package 300 includes IC die 102, substrate 104, plurality of solder balls 106, one or more wire bonds 108, and a package stiffener/heat spreader 304. As shown in FIG. 3, IC die 102 is located on the same side of BGA package 300 as are solder balls 106. Substrate 104 has a centrally located window shaped opening to accommodate IC die 102 and wire bonds 108. Package stiffener/heat spreader 304 mounts IC die 102, and provides for structural support for BGA package 300, and aids in the spreading of heat from IC die 102. The configuration of BGA package 300 lacks a connection to the PCB from IC die 102 in the center of the package, and hence no direct electrical or thermal path to the PCB exists.

The present invention is applicable to improving thermal and electrical performance in the BGA package types described herein, and in other BGA package types.

BGA Embodiments According to the Present Invention

Further details of structural and operational implementations of ball grid array packages of the present invention are described in the following sections. These structural and operational implementations are described herein for illustrative purposes, and are not limiting. For instance, the present invention as described herein may be implemented in both die-up and die-down BGA package types, as well as other IC package types. Furthermore, each of the embodiments presented below are applicable to tape substrate BGA packages, plastic substrate BGA packages, and ceramic substrate BGA packages. The description below is adaptable to these and other package types, as would be understood to persons skilled in the relevant art(s) from the teachings herein. For instance, in some tape BGA packages, a stiffener may be required in the BGA package.

Features of each of the embodiments presented below may be incorporated into BGA packages independently, or may be combined in any manner, as would be apparent to persons skilled in the relevant art(s) from the teachings herein.

Wire Bonded IC Die Embodiments

According to embodiments of the present invention, the mechanical. Electrical, and thermal performances of a BGA package are enhanced by attaching a heat spreader underneath the BGA package, to a bottom surface of the substrate. An IC die is mounted directly to the heat spreader through a window opening in the substrate, or is mounted to the top surface of the substrate. Furthermore, in a preferred embodiment, a stiffener or metal ring is also attached to the top surface of the substrate.

Figure 5:
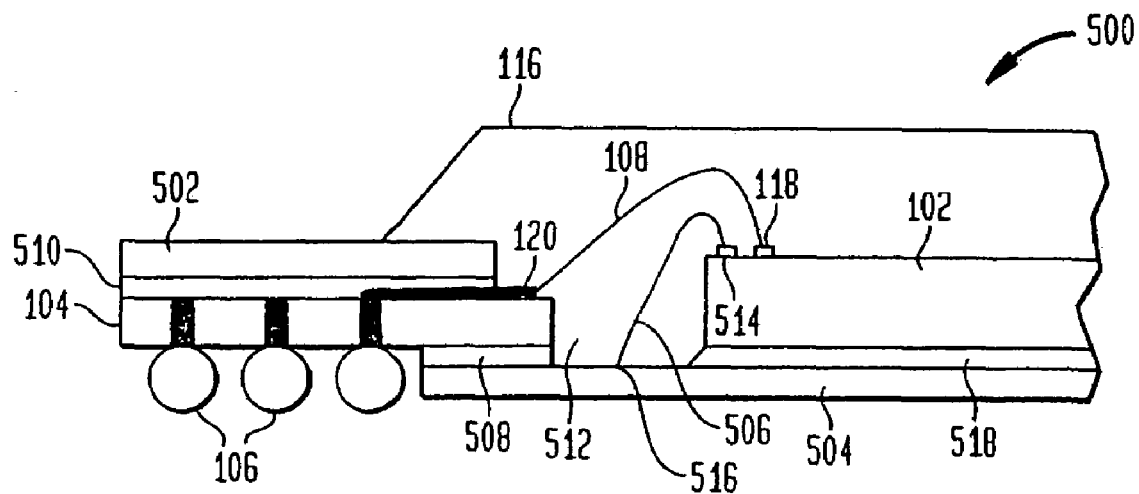
FIG. 5 illustrates a cross-sectional view of a portion of a die-up BGA package with heat spreader, according to an embodiment of the present invention.
Figure 6:
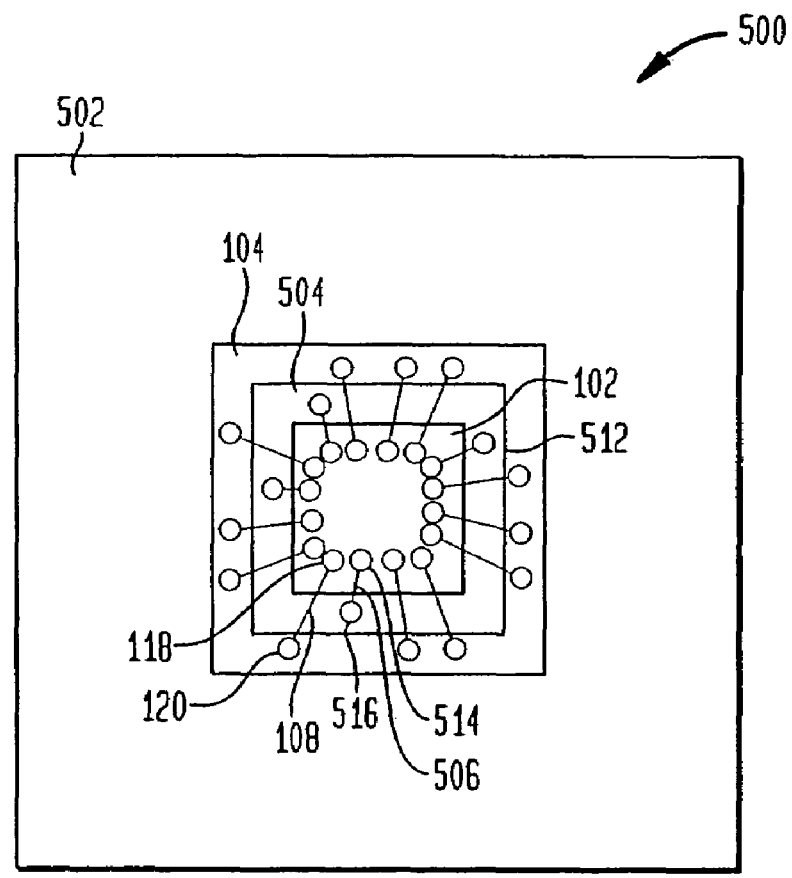
FIG. 6 shows a top view of the die-up BGA package of FIG. 5, according to an embodiment of the present invention.

FIG. 5 illustrates a cross-sectional view of a portion of a die-up tape BGA package 500, according to an embodiment of the present invention. BGA package 500 includes IC die 102, substrate 104, plurality of solder balls 106, one or more wire bonds 108, encapsulant 116, a stiffener or ring 502, a heat spreader 504, and one or more ground wire bonds 506. FIG. 6 illustrates a top view of die-up tape BGA package 500 (encapsulate 116 not shown).

One or more wire bonds 108 connect corresponding bond pads 118 on IC die 102 to contact points 120 on substrate 104.

Figure 12:
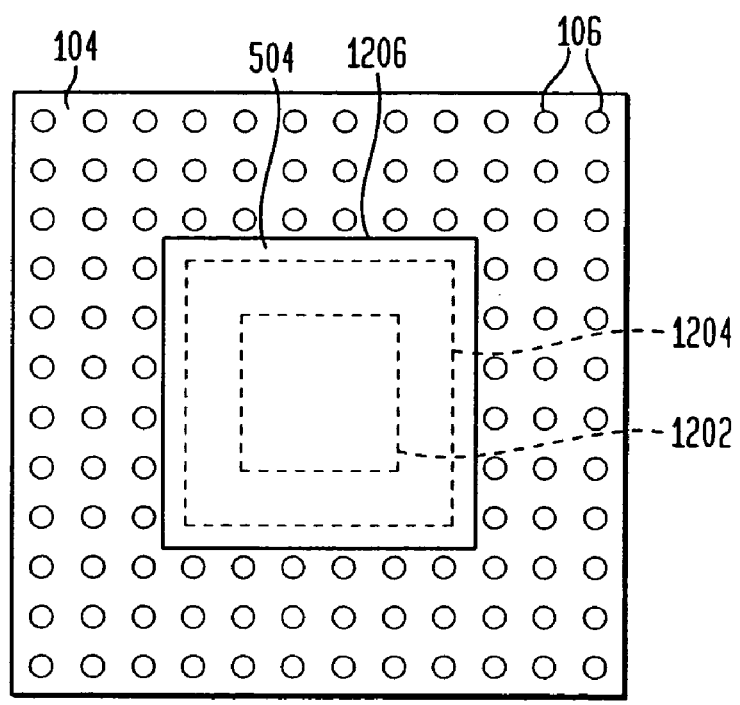
FIG. 12 illustrates solder balls and a heat spreader attached to a substrate, according to an embodiment of the present invention.
Figure 14:
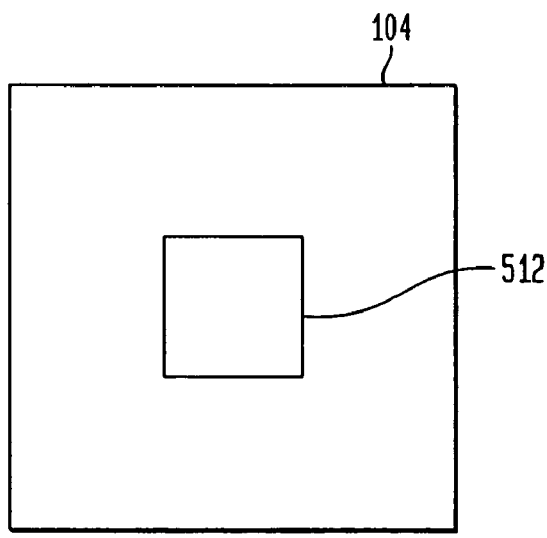
FIG. 14 shows a top view of a substrate with a central window-shaped opening.

Substrate 104 has a bottom surface to which atop surface of heat spreader 504 is attached by a laminate or adhesive 508. The plurality of solder balls 106 are attached to a bottom surface of substrate 104. The plurality of solder balls 106 connect to vias and/or points on the bottom surface of substrate 104 to which signals internal to substrate 104 are routed and exposed. Substrate 104 in FIG. 5 has a central window-shaped opening 512, which is covered on the bottom surface of substrate 104 by heat spreader 504. FIG. 14 shows a top view of substrate 104 with central window-shaped opening 512. Central window shaped opening 506 accommodates IC die 102 and wire bonds 506. FIG. 12 illustrates a bottom view of a substrate 104, with heat spreader 504 attached. The plurality of solder balls 106 are attached to substrate 104 outside an outer dimensional profile of heat spreader 504.

As shown in FIG. 5, a bottom surface of IC die 102 is mounted on a top surface of heat spreader 504 using a thermally conductive adhesive 518 or similar substance. Adhesive 518 may be the same substance as encapsulant 116, or may be a different substance. Silver filled epoxies may be used for adhesive 518 to enhance heat extraction from IC die 102. By configuring heat spreader 504 between IC die 102 and the PCB, a direct thermal path is formed between the IC die 102 and PCB, improving thermal performance.

The material used for heat spreader 504 may be one or more metals such as copper and aluminum, for example. Heat spreader 504 may be machined, molded, or otherwise manufactured from these materials. Heat spreader 504 may be made from the same material as ring 502, for example.

In an embodiment, heat spreader 504 is configured to operate as a ground plane or power plane. For example, one or more power or ground wire bonds 506 may be used to connect bond pads 514 on IC die 102 to contact points 516 on heat spreader 504. One or more ground wire bonds may also be coupled from IC die 102 to a ground ring around the peripheral of IC die 102. For example, the ground ring may be a silver or palladium plated ground ring. The bottom surface of heat spreader 504 can be attached to a connection area on a PCB using solder, conductive epoxy, or other substance. The PCB connection area is connected to a PCB power or ground plane. Such a configuration may reduce or eliminate power or ground traces on substrate 104, and reduce the number of solder balls attached to substrate 104 that are dedicated to power or ground. This configuration may also lead to shorter current travel lengths, and may reduce inductance and resistance related to the BGA package. For example, this configuration may enhance electrical performance regarding simultaneous switching noise.

In an embodiment, stiffener or ring 502 is attached to the top surface of substrate 104. Ring 502 may be attached to substrate 104 by a laminate or adhesive 510. Encapsulant 116 is filled in and flushed to ring 502 after the attachment of ring 502. Ring 502 is preferably made of a metal, such as copper or aluminum, or a combination thereof, but may also be constructed from other applicable materials. Preferably, ring 502 is made from the same material as heat spreader 504, to minimize the mismatch of the thermal expansion coefficients. Ring 502 is preferably flush with the outer edges of substrate 104 to form an outer edge of the BGA package, but may also reside entirely within or partially outside an outer profile of substrate 104.

A primary benefit of attaching ring 502 to substrate 104 is an increase in stiffness of BGA package 500. Ring 502 may also aid in reducing the amount of warp of BGA package 500. Furthermore, ring 502 promotes heat dissipation from substrate 104, and may facilitate the attachment of an external heat spreader to BGA package 500.

Furthermore, ring 502 enhances the process of encapsulation of the BGA package. Ring 502 aids in creating a cavity that may be filled with a dispensed glob top or encapsulating material, such as encapsulant 116, that locks IC die 102 and surrounding elements in place.

As described above, FIG. 12 shows a bottom view of a BGA package, with solder balls 106 and heat spreader 504 attached to substrate 104, according to an embodiment of the present invention. An outer dimensional profile 1202 of IC die 102 and an inner dimensional profile 1204 of ring 502 are shown, as would be seen through substrate 104 and heat spreader 504 if transparent. An outer dimensional profile 1206 of heat spreader 504 is also indicated. In a preferred embodiment, as shown in FIG. 12, outer profile 1206 of heat spreader 504 overlaps with inner profile 1204 of ring 502. This overlapping portion provides for a low resistance thermal path from IC die 102 to solder balls 106, including those solder balls 106 at a peripheral of the BGA package, through heat spreader 504, ring 502, and substrate 104.

Note that vias may be formed in substrate 104, in the overlapping area, which may be filled with a conductive material to couple ring 502 to heat spreader 504, for greater thermal transfer. Furthermore, note that heat spreader 504 may be shaped in a variety of ways in addition to the rectangular shape shown in FIG. 12, such as elliptically or irregularly shaped.

Figure 7:
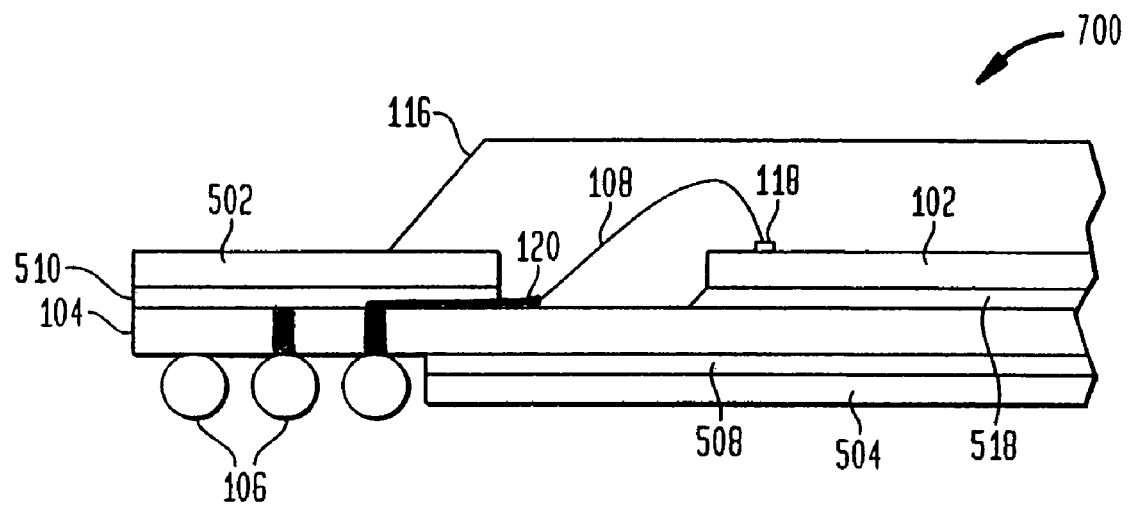
FIG. 7 illustrates a cross-sectional view of a portion of a die-up BGA package with heat spreader, according to an embodiment of the present invention.
Figure 8:
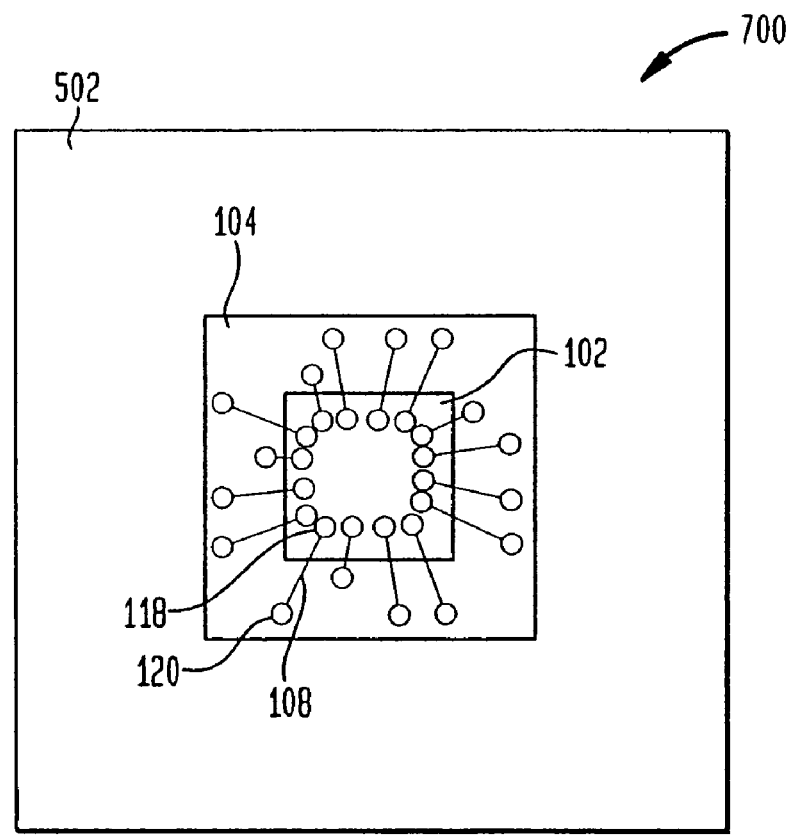
FIG. 8 shows a top view of the die-up BGA package of FIG. 7, according to an embodiment of the present invention.

FIG. 7 illustrates a cross-sectional view of a portion of a die-up BGA package 700 with heat spreader 504, according to an alternative embodiment of the present invention. FIG. 8 shows a top view of die-up BGA package 700, according to an embodiment of the present invention (encapsulant 116 not shown). Die-up BGA package 700 is configured substantially similar to BGA package 500, and the discussion above regarding the elements of BGA package 500 substantially applies to the similar elements of BGA package 700, subject to the following description.

In the embodiment of BGA package 700 shown in FIGS. 7 and 8, IC die 102 is mounted to substrate 104 using adhesive 518 or similar substance, instead of being mounted to heat spreader 504 as in BGA package 500 of FIG. 5. Substrate 104 of BGA package 700 does not include a central window shaped opening as does the substrate of BGA package 500 described above. Heat spreader 504 is attached to the bottom surface of substrate 104, and does not directly mount IC die 102. Heat is transferred through substrate 104 from IC die 102, to heat spreader 504. As described above, heat spreader 504 aids in dissipating heat produced by IC die 102 by transferring the heat to a PCB to which heat spreader 504 is attached, and/or by transferring heat through substrate 104 to ring 502. Ring 502 transfers the heat to a PCB through solder balls 106, and/or transfers heat to a heat sink coupled to ring 502 directly.

The embodiments provided above in this section are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

Flip Chip IC Die Embodiments

According to embodiments of the present invention, the mechanical, electrical, and thermal performances of a BGA package are enhanced by attaching a heat spreader underneath the BGA package, to a bottom surface of the package substrate. An IC die is mounted on a top surface of the substrate, in a flip chip configuration. In a preferred embodiment, a stiffener or metal ring is also attached to the top surface of the substrate. Furthermore, a second heat spreader may be attached to the IC die and metal ring to further enhance mechanical, electrical, and thermal performances.

Figure 9:
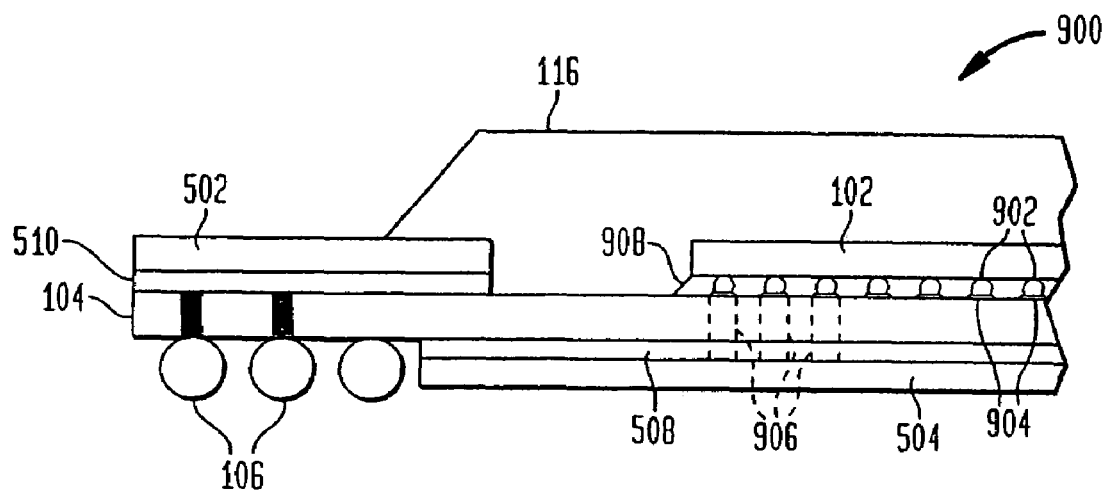
FIG. 9 illustrates a cross-sectional view of a portion of a die-up flip chip BGA package with heat spreader, according to an embodiment of the present invention.

FIG. 9 illustrates a cross-sectional view of a portion of a die-up flip chip BGA package 900 with heat spreader 504, according to an embodiment of the present invention. BGA package 900 includes IC die 102, substrate 104, plurality of solder balls 106, encapsulant 116, ring 502, and heat spreader 504. Die-up flip chip BGA package 900 is configured substantially similar to BGA package 700, and the discussion above regarding the elements of BGA package 700 substantially applies to the similar elements of BGA package 900, subject to the following description.

In the embodiment of BGA package 900 shown in FIG. 9, an active surface of IC die 102 is attached to substrate 104 with a plurality of conductive bumps 902, such as solder balls, located on the bottom (active) surface of IC die 102, by a process commonly referred to as "C4" or "flip chip" packaging. The conductive bumps 902 couple to conductive pads 904 on the surface of substrate 104.

An underfill 908, such as an epoxy or encapsulant, may be applied in the gap between IC die 102 and substrate 104 to strengthen their interconnection.

As described above, heat spreader 504 aids in dissipating heat produced by IC die 102 by transferring the heat to a PCB to which heat spreader 504 is attached, and/or by transferring heat through substrate 104 to ring 502. In an embodiment, thermal and electrical performance may be enhanced by forming one or more vias 906 in substrate 104 to couple conductive bumps 902 and conductive pads 904 more directly to heat spreader 504. Vias 906 may be filled with a conductive material to enhance the thermal and electrical performance of this arrangement. For example, when heat spreader 504 is coupled to a ground or voltage potential of a PCB, vias 906 may be used to provide a short path for the ground or voltage potential of the PCB to IC die 102.

Figure 10:
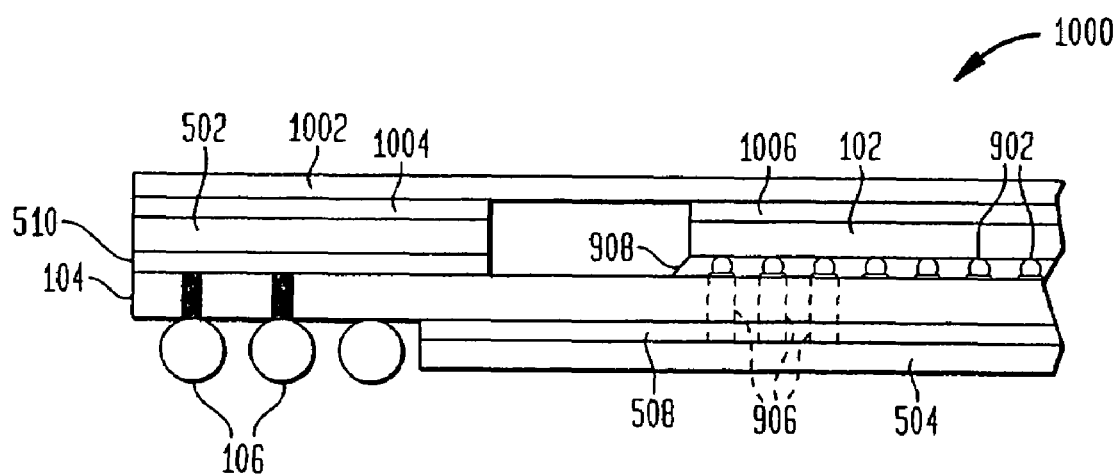
FIG. 10 illustrates a cross-sectional view of a portion of a die-up flip chip BGA package with two heat spreaders, according to an embodiment of the present invention.

FIG. 10 illustrates a cross-sectional view of a portion of a die-up flip chip BGA package 1000 with first and second heat spreaders 504 and 1002, according to an embodiment of the present invention. Die-up BGA package 1000 is configured substantially similar to BGA package 900, and the discussion above regarding the elements of BGA package 900 substantially applies to the similar elements of BGA package 1000, subject to the following description.

In the embodiment of BGA package 1000 shown in FIG. 10, a second heat spreader 1002 is attached to a top surface of IC die 102 and a top surface of ring 502 (when present). Second heat spreader 1002 is attached to ring 502 by an adhesive 1004, which may be an epoxy, laminate, or similar substance, and is attached to IC die 102 by adhesive 1006, which may be an epoxy, laminate, or similar substance. For example, adhesives 1004 and 1006 may be the same substance as encapsulant 116, the same material as adhesive 518, or may be a different substance. Silver filled epoxies may be used for adhesive 1006 to enhance heat extraction from IC die 102.

The material used for second heat spreader 1002 may be the same as, or different than the material used for heat spreader 504. For example, second heat spreader 1002 may be one or more metals such as copper and aluminum, for example. Heat spreader 1002 may be machined, molded, or otherwise manufactured from these materials. Heat spreader 1002 may be made from the same material as ring 502, for example. Furthermore, heat spreader 1002 may be shaped in a variety of ways.

Second heat spreader 1002 aids in dissipating heat produced by IC die 102 by transferring heat to ring 502 for transfer to a PCB, and by increasing heat dissipation into the environment. Furthermore, second heat spreader 1002 facilitates the connection of additional heat spreaders/heat sinks, such as fin type heat spreaders, to BGA package 1000. In other words, these additional heat spreaders can be attached to the top of heat spreader 1002.

The embodiments provided above in this section are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

Figure 13:
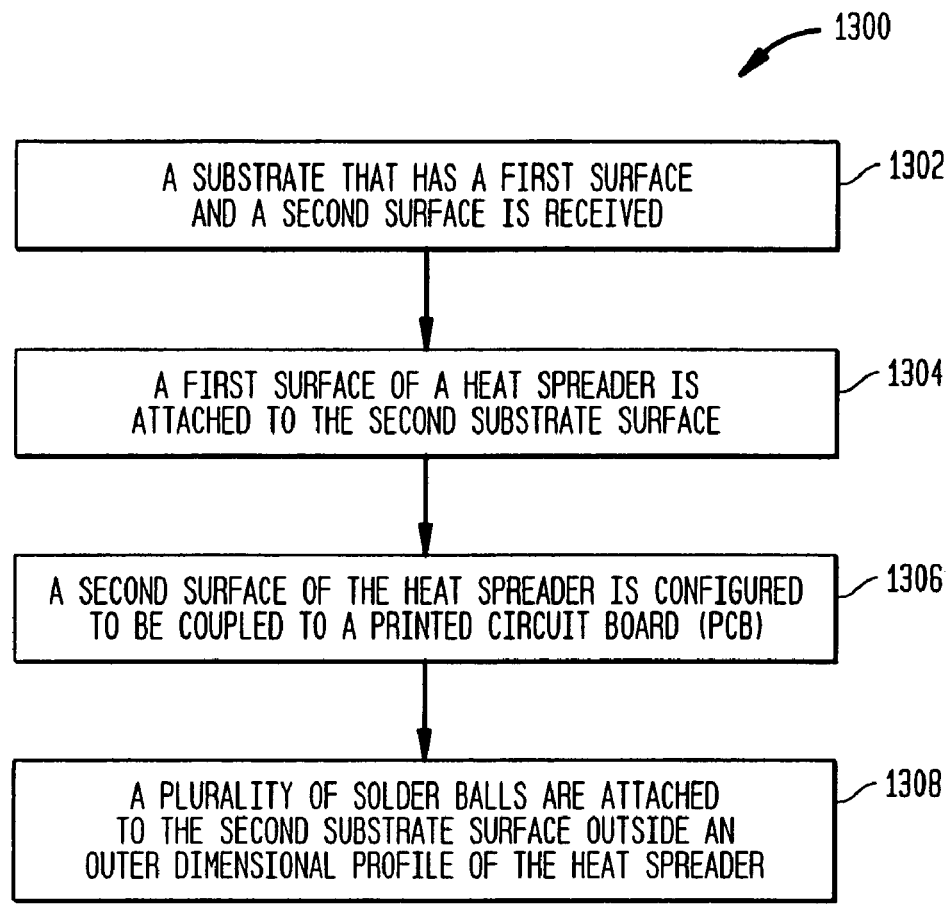
FIG. 13 shows a flowchart that provides operational steps of exemplary embodiments of the present invention.

Assembling Ball Grid Array Packages According to Embodiments of the Present Invention FIG. 13 shows a flowchart 1300 providing operational steps for assembling one or more embodiments of the present invention. The steps of FIG. 13 do not necessarily have to occur in the order shown, as will be apparent to persons skilled in the relevant art(s) based on the teachings herein. Other embodiments will be apparent to persons skilled in the relevant art(s) based on the following discussion. These steps are described in detail below.

Flowchart 1300 begins with step 1302. In step 1302, a substrate that has a first surface and a second surface is received. For example, the substrate is tape substrate 104, or another substrate type suitable for a BGA package. An IC die mounting position and/or contact points may be provided on a first, upper surface, and solder ball pads may be provided on a second, bottom surface of the substrate.

In step 1304, a first surface of a heat spreader is attached to the second substrate surface. For example, the heat spreader is heat spreader 504, which is attached to substrate 104.

In step 1306, a second surface of the heat spreader is configured to be coupled to a printed circuit board (PCB). For example, the second surface of heat spreader 504 may be formed as a substantially flat surface to conform to a PCB surface. The second heat spreader surface may be enabled to be surface mounted to soldering pads on the PCB. For example, the second surface of heat spreader 504 may be plated with solder or other metals such as nickel, gold, or layers of different metals, to aid in the surface mount process.

In step 1308, a plurality of solder balls are attached to the second substrate surface outside an outer dimensional profile of the heat spreader. For example, the plurality of solder balls are plurality of solder balls 106, which connect to vias and/or solder ball pads on the bottom surface of substrate 104. The solder balls may be arranged on the bottom surface of substrate 104 as shown in FIG. 12, or in alternative arrangements. The solder balls are used to attach a BGA package, and signals within, to a PCB.

Flowchart 1300 may include the additional step where a metal ring is attached to the first substrate surface. Attaching the metal ring enhances heat dissipation from the IC die and provides rigidity to the BGA package. For example, the metal ring is stiffener or ring 502.

In an embodiment, step 1304 includes the step where a first surface of the heat spreader is attached to the second substrate surface, wherein an outer profile of the heat spreader overlaps with an inner profile of the metal ring. For example, such an arrangement for heat spreader 504 and ring 502 is shown in FIGS. 5, 7, 9, and 10. In alternative embodiments, portions or all of heat spreader 504 and ring 502 do not overlap.

Flowchart 1300 may include the additional step where a window opening is formed in the substrate. For example, substrate 104 shown in FIG. 5 includes a central window shaped opening 512. It will be known to persons skilled in the relevant art(s) how to form an opening in a substrate. Such an opening is preferably formed during the substrate manufacturing process.

Flowchart 1300 may include the additional step where an integrated circuit (IC) die is mounted to the first heat spreader surface, wherein the IC die is accessible through the window opening, and may extend at least partially through the window opening. For example, as shown in FIG. 5, IC die 102 resides at least partially within window shaped opening 512.

In an embodiment, the IC die has a surface that includes at least one contact pad, such as contact pad 118. Flowchart 1300 may include the additional step where a wire bond is coupled between one or more of the at least one contact pad and a corresponding metal trace on the first substrate surface. For example, wire bond 108 is coupled between contact pad 118 and contact point 120 on substrate 104. Contact point 120 is a contact point on a metal trace on the surface of substrate 104.

In an embodiment, the IC die has a surface that includes at least one ground contact pad, such as ground contact pad 514. Flowchart 1300 may include the additional step where a ground wire bond is coupled between at least one ground contact pad and the first heat spreader surface. For example, ground wire bond 506 is coupled between contact pad 514 and contact point 516 on heat spreader 504, as shown in FIG. 5.

Flowchart 1300 may include the additional step where the second heat spreader surface is coupled to a ground potential of the PCB. For example, heat spreader 504 may be coupled to one or more conductive pads on a surface of the PCB that are coupled to PCB ground.

Flowchart 1300 may include the additional step where an integrated circuit (IC) die is mounted to the first substrate surface. For example, IC die 102 is mounted to substrate 104, as shown in FIG. 7.

Flowchart 1300 may include the additional step where the IC die is mounted to the first substrate surface in a flip chip configuration. For example, as shown in FIG. 9, IC die 102 is mounted to substrate 104 in a flip chip configuration.

Flowchart 1300 may include the additional step where at least one conductive bump on an active surface of the IC die is connected to a corresponding conductive pad on the first substrate surface. For example, the plurality of conductive bumps 902 are coupled to corresponding conductive pads 904 on substrate 104.

Flowchart 1300 may include the additional step where a surface of a metal ring is attached to the first substrate surface. For example, ring 502 is attached to substrate 104, as shown in FIG. 9.

In an embodiment, step 1304 includes the step where a first surface of the heat spreader is attached to the second substrate surface, wherein an outer profile of the heat spreader overlaps with an inner profile of the metal ring. For example, such an arrangement for heat spreader 504 and ring 502 is shown in FIGS. 5, 7, 9, and 10. In alternative embodiments, portions or all of heat spreader 504 and ring 502 do not overlap.

Flowchart 1300 may include the additional step where a second heat spreader is attached to a non-active surface of the IC die and a second surface of the metal ring. For example, second heat spreader 1002 is attached to IC die 102 and ring 502 (when present) as shown in FIG. 10.

Flowchart 1300 may include the additional step where at least one of the conductive bumps is coupled to the heat spreader through at least one via that extends through the substrate. In an embodiment, this step may include the step where the at least one via is filled with a conductive material. For example, these vias are vias 906 shown in FIG. 9.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A ball grid array (BGA) package, comprising:
   a substrate having a plurality of contact pads on a first surface electrically connected through the substrate to a plurality of solder ball pads on a second surface of the substrate, the first surface of the substrate including a centrally located portion capable of mounting an integrated circuit (IC) die;
   a heat spreader that has a first surface and a second surface, wherein the first surface of the heat spreader is attached to the second surface of the substrate;
   a thermally conductive adhesive that attaches the first surface of the heat spreader to the second surface of the substrate; and
   a ring shaped stiffener being centrally open in a first surface and a second surface, wherein the first surface of the ring shaped stiffener is attached to the first surface of the substrate;
   wherein the second surface of the heat spreader is capable of being coupled to a printed circuit board (PCB).

2. The package of claim 1, wherein the heat spreader comprises at least one metal.

3. The package of claim 2, wherein the at least one metal includes copper.

4. The package of claim 2, wherein the at least one metal includes aluminum.

5. The package of claim 1, wherein the heat spreader is substantially planar.

6. The package of claim 1, further comprising:
   a thermally conductive adhesive that attaches the first surface of the ring shaped stiffener to the first surface of the substrate.

7. The package of claim 1, wherein the ring shaped stiffener comprises at least one metal.

8. The package of claim 7, wherein the at least one metal includes copper.

9. The package of claim 7, wherein the at least one metal includes aluminum.

10. The package of claim 1, further comprising:
    a plurality of solder balls attached to the plurality of solder ball pads.

11. The package of claim 1, wherein an outer surface of the ring shaped stiffener is flush with an outer edge of the substrate.

12. The package of claim 1, wherein an outer profile of the heat spreader overlaps with an inner profile of the ring shaped stiffener.

13. A ball grid array (BGA) package, comprising:
- a substrate having a plurality of contact pads on a first surface electrically connected through the substrate to a plurality of solder ball pads on a second surface of the substrate, the first surface of the substrate including a centrally located portion capable of mounting an integrated circuit (IC) die;
- a heat spreader that has a first surface and a second surface, wherein the first surface of the heat spreader is attached to the second surface of the substrate; and
- a ring shaped stiffener being centrally open in a first surface and a second surface, wherein the first surface of the ring shaped stiffener is attached to the first surface of the substrate;
- wherein the second surface of the heat spreader is capable of being coupled to a printed circuit board (PCB); and
- wherein the second surface of the heat spreader is plated with solder that allows the second surface of the heat spreader to be surface mounted to soldering pads on the PCB.

14. The package of claim 1, wherein the substrate is a tape substrate.

15. The package of claim 1, further comprising:
- the IC die mounted to the first surface of the substrate.

16. The package of claim 15, wherein the IC die has a surface that includes a contact pad, and wherein the package further comprises a wire bond that couples the contact pad to a corresponding metal trace on the first surface of the substrate.

17. The package of claim 15, further comprising:
- an encapsulating material that fills a cavity formed by the ring shaped stiffener and the first surface of the substrate to encapsulate the IC die.

18. The package of claim 13, wherein an outer surface of the ring shaped stiffener is flush with an outer edge of the substrate.

19. The package of claim 13, wherein an outer profile of the heat spreader overlaps with an inner profile of the ring shaped stiffener.

20. The package of claim 13, further comprising:
- the IC die mounted to the first surface of the substrate.

21. The package of claim 20, wherein the IC die has a surface that includes a contact pad, and wherein the package further comprises a wire bond that couples the contact pad to a corresponding metal trace on the first surface of the substrate.

* * * * *